Figure 1:
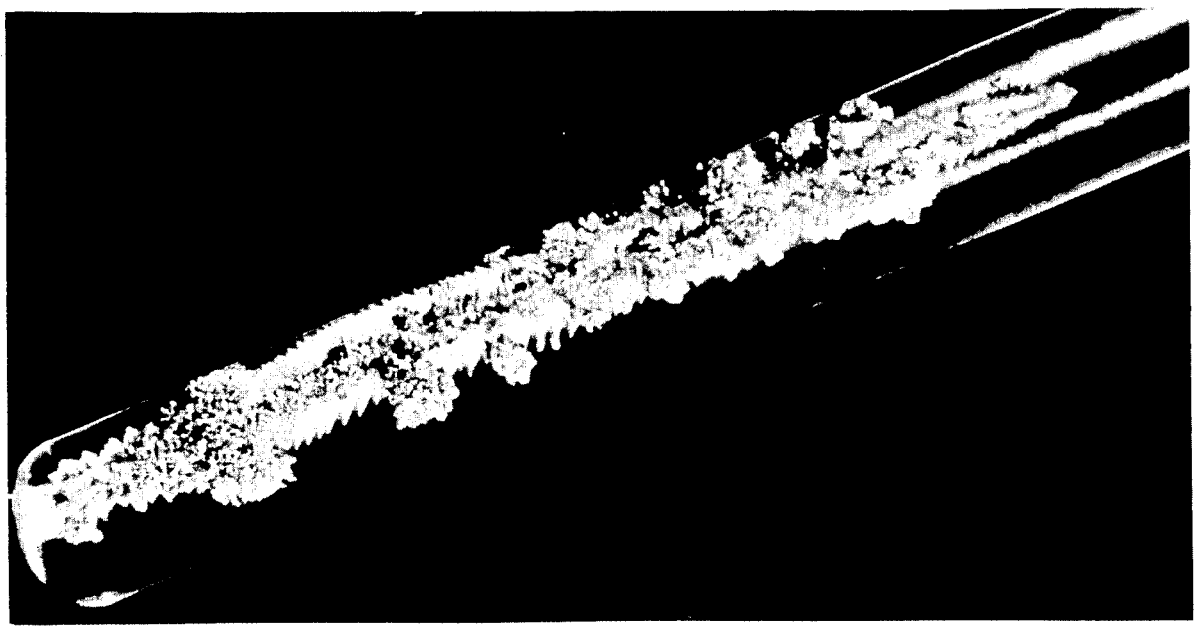

United States Patent [19]

Mahalla

[11] 4,086,082

[45] Apr. 25, 1978

[54] COPPER CRYSTAL AND PROCESS

[76] Inventor: Shalom Mahalla, P.O. Box 11183, Phoenix, Ariz. 85017

[21] Appl. No.: 677,690

[22] Filed: Apr. 16, 1976

[51] Int. Cl.$^2$ .......................... B22F 9/00; C22B 15/12
[52] U.S. Cl. ..................................... 75/.5 A; 75/108; 75/109; 75/251
[58] Field of Search ............................ 423/38, 39, 40; 75/.5 A, .5 AA, 97 R, 97 A, 104, 108, 109, 117, .5 B, .5 BA, 72, 73, 74, 75, 76, 251; 204/10

[56] References Cited

U.S. PATENT DOCUMENTS

| 1,263,727 | 4/1918 | Anderson | 75/117 |
|---|---|---|---|
| 3,060,013 | 10/1962 | Harvey | 75/72 |
| 3,529,954 | 9/1970 | Cech | 75/.5 BA |
| 3,798,026 | 3/1974 | Milner et al. | 423/38 |
| 3,860,509 | 1/1975 | Emmett, Jr. | 204/10 |
| 3,902,865 | 9/1975 | Leavenworth et al. | 75/.5 BA |

OTHER PUBLICATIONS

*Hackh's Chemical Dictionary* 4th ed.; McGraw Hill, N.Y. p. 724 (1972).

Bunescu, et al.; "Conference On Electrotechnical Materials," Bucharest, Rumania; (1970) pp. 1–12.
Sard, R., et al.; "Mechanical Properties of Single Crystal Copper Electrodeposits"; *Plating* (2/1969), pp. 157–162.
Mehl, E.; "Production of Metal Powders" *Metal Treatment and Drop Forging* (Summer, 1950) pp. 118–126.

*Primary Examiner*—L. Dewayne Rutledge
*Assistant Examiner*—Michael L. Lewis
*Attorney, Agent, or Firm*—William H. Drummond; Gregory J. Nelson; LaValle D. Ptak

[57] ABSTRACT

A new article of manufacture consisting of a crystal of copper which is macrocrystalline, unicrystalline, columnar and consists of a single prime particle bounded by at least two sets of distinguishable planes which are determined by the internal crystal structure. These planes are cube faces, i.e., (100) type planes in the crystal and define surface facets which are parallel, non-coplanar, crystallographic step-growth surfaces. The crystal orientation is such that a (110) plane is perpendicular to the long axis of the crystal with a ($\bar{1}$11) plane lying perpendicular to the smallest cross-section thereof.

3 Claims, 45 Drawing Figures

AS-GROWN CRYSTAL
MAGNIFICATION 2X

CRYSTAL OF FIG. 1
MAGNIFICATION 8X

CRYSTAL OF FIG. 1
MAGNIFICATION 10X

FOUR DIFFERENT CRYSTAL SHAPES

MAGNIFIED VIEW OF "FEATHERY" TYPE CRYSTAL SHOWN IN FIG. 4.

MAGNIFIED VIEW OF FIG. 5A SHOWING
A "BLOCKY" TYPE EXTERNAL MORPHOLOGY

PHOTOMICROGRAPHY OF ELECTROLYTICALLY
REFINED COPPER.   MAGNIFICATION 200X

SURFACE OF COPPER CATHODE
MAGNIFICATION 800X

SCANNING ELECTRON MICROGRAPHS
OF CRYSTALS OF FIG. 5A

MAGNIFICATION 400X

MAGNIFICATION 800X

MAGNIFICATION 10,000X

PHOTOMICROGRAPHS OF "AS-GROWN" CRYSTALS.   MAGNIFICATION 100X

PHOTOMICROGRAPHS OF "AS-GROWN"
CRYSTALS. MAGNIFICATION 100X

X-RAY LAUE PATTERNS
("AS-GROWN" CRYSTALS)

CRYSTAL IA. X-RAY TAKEN NEAR CENTER

CRYSTAL IB. X-RAY TAKEN NEAR TOP

CRYSTAL IC. X-RAY TAKEN NEAR CENTER

CRYSTAL IC. X-RAY TAKEN NEAR TOP

CONTINUATION OF FIG. 11

CRYSTAL I D. X-RAY TAKEN NEAR CENTER

CRYSTAL I D. X-RAY TAKEN NEAR TOP

PHOTOMICROGRAPH OF CRYSTALS AS CAST
MAGNIFICATION 200X

X-RAY PIN-HOLE LAUE PATTERNS
AFTER ANNEALING 50% COLD WORKED STRIPS
FOR I HOUR AT VARIOUS TEMPERATURES.

INGOT AFTER ROLLING TO
0.200 INCHES THICKNESS

AFTER 350°C VACUUM ANNEAL

AFTER COLD WORKING TO 50% R.A.

AFTER ANNEALING FOR I HOUR AT 175°C

CONTINUATION OF FIG. 13

AFTER ANNEALING FOR I HOUR AT 200°C

AFTER ANNEALING FOR I HOUR AT 225°C

AFTER ANNEALING FOR I HOUR AT 250°C

AFTER ANNEALING FOR I HOUR AT 260°C

CONTINUATION OF FIG. 13

AFTER ANNEALING FOR I HOUR AT 270°C

AFTER ANNEALING FOR I HOUR AT 280°

AFTER ANNEALING FOR I HOUR AT 300°C

X-RAY PIN-HOLE LAUE PATTERNS
AFTER ANNEALING 75% COLD WORKED STRIPS
FOR I HOUR AT VARIOUS TEMPERATURES

COLD WORKED TO 75% R.A.

AFTER ANNEALING FOR I HOUR AT 200°C

AFTER ANNEALING FOR I HOUR AT 250°C

AFTER ANNEALING FOR I HOUR AT 300°

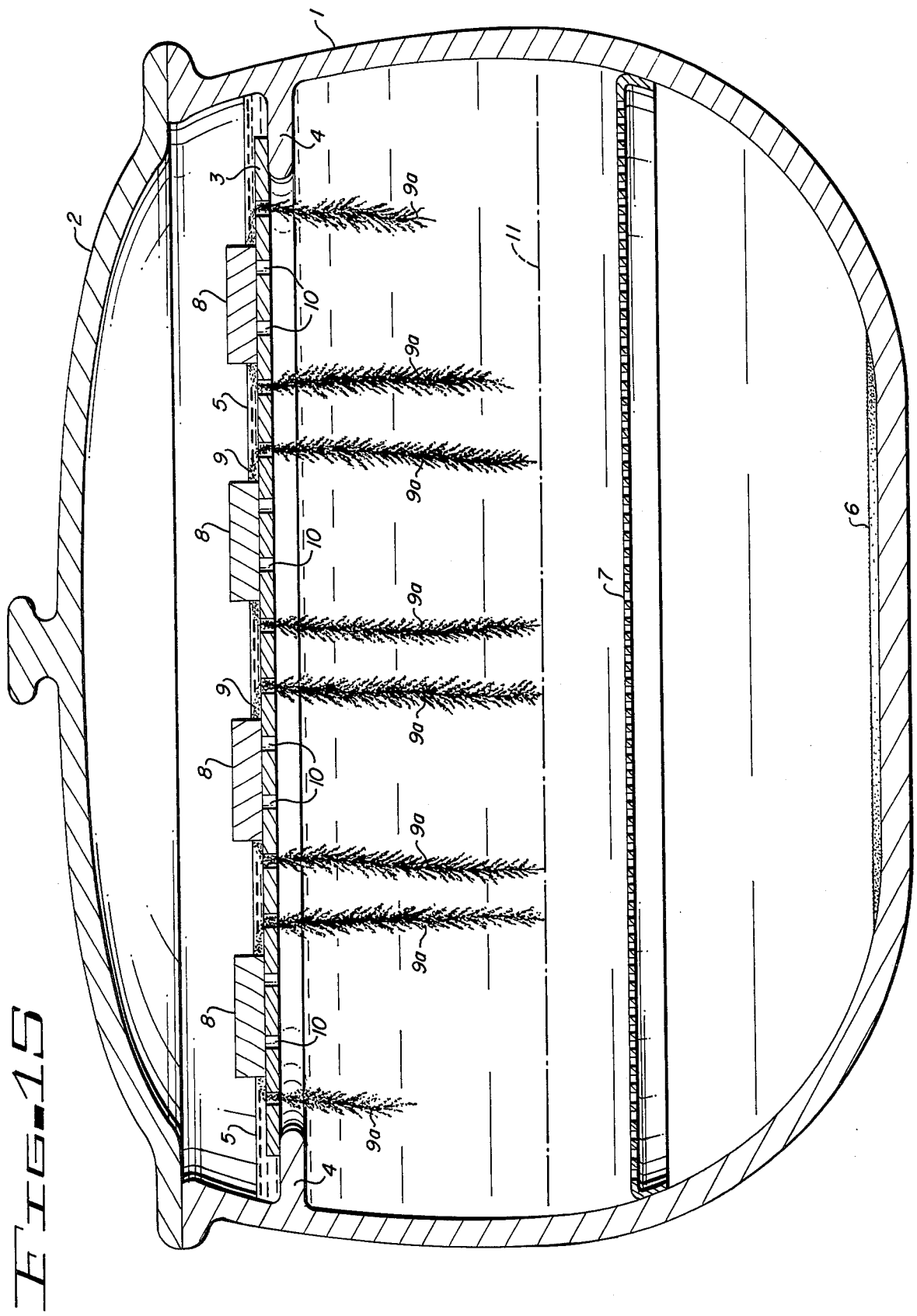

COPPER CRYSTAL AND PROCESS

This invention concerns a new article of manufacture consisting of a copper crystal having unique characteristics.

In another respect, the invention relates to a new process for manufacturing copper crystals.

In still another aspect, the invention concerns a new process for winning copper values from solutions thereof.

In a further respect, the invention relates to novel copper crystals which are produced by entirely hydrometallurgical means from solutions containing copper values.

In still another and further respect, the invention relates to processes for winning copper values from naturally occurring sources, scrap, etc., which yield a copper product having novel crystalline characteristics, having extremely high purity and having strikingly improved electrical and mechanical properties.

Most of the world's present copper supplies are produced by a combination of pyrometallurgical and electrorefining techniques. Copper ores are milled to produce a concentrate and these concentrates, along with other relatively impure copper-bearing materials such as scraps, cement copper, etc., are then smelted at high temperature with fluxes, the major impurities being removed by oxidation and chemical combination with the flux materials. The resultant product, called "blister copper", is then subjected to further "fire-refining" steps in which most of the remaining impurities are oxidized and the fire-refined copper is then cast into thick sheets called "anodes".

The copper anodes are of relatively high purity but still contain trace quantities of impurities which materially affect the electrical and mechanical properties of the copper. These trace impurities are conventionally separated in an electrorefining step in which the copper anodes are placed in cells, alternately spaced with thin starter sheets of copper which form the cathode of the electrorefining cell. An electrical potential is applied between the anodes and the cathodes and by proper adjustment of cell parameters, the anode copper dissolves in the electrolyte and plates out on the starter sheet, forming copper cathodes of still higher purity, most of the impurities settling to the bottom of the refining cell as a "mud".

The cathode copper produced by electrorefining is then melted under carefully controlled conditions and the oxygen content is carefully adjusted to about 0.03% – 0.06% and the resulting melt, called "electrolytic tough pitch" copper (ETP) is then cast into a variety of useful shapes such as wire bars, cakes, billets and ingots. These shapes are then fabricated into end products such as wire, tubes, rods, etc. For certain applications, the ETP copper is subjected to special de-oxidizing procedures to produce so-called "oxygen-free, high-conductivity" copper (OFHC), essentially free of cuprous oxide, before casting the molten copper into the various useful shapes.

Electrolytically refined cathode copper can also be treated to produce copper powders for use in powder metallurgy applications. The copper cathodes are subjected to further electrolytic processes in which the electrorefined cathode copper becomes the anode and the cell is specially constructed and operated such that, upon electrolysis, the copper dissolves and deposits as discrete particles of controlled size and shape.

In addition to the pyrometallurgical - electrolytic processes described above, a substantial amount of copper is produced by hydrometallurgical techniques in which the copper-bearing materials are leached to produce solutions containing copper values which are subsequently precipitated by either chemical or electrolytic means. These hydrometallurgical processes have been limited largely to copper-bearing materials that, because of grade or composition, do not lend themselves to economic treatment by the previously described pyrometallurgical techniques. The electrically or chemically precipitated copper produced by hydrometallurgical processes still requires further electrorefining as in the case of the anode copper produced by pyrometallurgical smelting processes.

One particular hydrometallurgical technique involves so-called "cementation" in which dilute solutions of copper are contacted with ferrous scrap materials. The iron in the ferrous scrap reduces the copper values in solution to metallic copper which precipitates from the solution as so-called "cement" copper, and the iron is itself oxidized and goes into solution. The cement copper is highly impure and must be then subjected to further chemical or pyrometallurgical refining, followed by electrorefining, in order to convert the copper into a commercially useful product.

Thus, there is no known commercially available copper product suitable for most electrical end-use applications which can be obtained without the final electrorefining techniques described above. Further, there is certainly no known copper product which is obtained directly, in a single step, by purely hydrometallurgical techniques applied to impure copper-bearing solutions.

I have now discovered and invented a new article of manufacture consisting of a copper crystal of novel configuration having electrical and mechanical properties which are superior and clearly distinct from any known products, whether electrorefined or not, and which can be manufactured in a single step directly from impure solutions of copper values without electrical or thermal energy input and without the evolution of any pollutants.

The new article of manufacture consists of a crystal of copper which is macrocrystalline, unicrystalline and columnar. The crystal is a single prime particle bounded by at least two sets of distinguishable planes which are determined by the internal crystal structure. These planes are cube faces, i.e., (100) type planes in a crystal and define surface facets which are parallel, noncoplanar, crystallographic step-growth surfaces. The crystal orientation is such that a (110) plane is perpendicular to the long axis of the crystal with a ($\bar{1}11$) plane lying in the surfaces perpendicular to the smallest cross-section thereof.

As used herein, the term "macrocrystalline" means distinguishable with the naked eye. In fact, by proper adjustment of parameters, one can easily manufacture crystals reaching lengths of three inches or more with cross-sectional dimensions of ¼ inch or greater.

The term "unicrystalline", as used herein, means that the article of manufacture is a single crystal. As will be described below, the process produces macrocrystals, at least some of which are unicrystalline, with the remainder consisting of only two or three single macrocrystals joined at a grain boundary.

The term "columnar", as used herein, means that the crystal is elongate, as distinguished from an equiaxed crystal or a chill crystal.

It is possible to grow a copper crystal which is macrocrystalline, unicrystalline and columnar under very carefully controlled laboratory conditions. Thus, a melt of extremely pure copper in a mold can be seeded with a microcrystal and then gradually cooled along the long axis of the mold such that a single columnar macrocrystal is produced. The external morphology of such a crystal will, however, be dictated by the shape of the mold cavity rather than by the internal crystal microstructure. By contrast, however, the new article of manufacture disclosed herein is a single prime particle bounded by at least two sets of distinguishable planes which are determined by, and in fact dictated by, the internal crystal structure. These two sets of distinguishable planes are in fact characteristic of the face-centered copper lattic structure, i.e., (100) type planes in a crystal with a (110) plane perpendicular to the long axis of the crystal and a ($\bar{1}$11) plane in the surfaces perpendicular to the smallest cross-section of the crystal. Further, these sets of planes define facets which are parallel and non-coplanar and lie in crystallorgraphic step-growth surfaces. Thus, the crystals of the present invention are distinguishable from a molded single columnar macrocrystal manufactured by the laboratory technique described above even if the laboratory mold is configured to provide the (100) planar boundaries described above, because the external morphology of the molded crystal is not determined by the internal crystal microstructure and the external surfaces of the molded crystal are not crystallographic step-growth surfaces.

Figure 2:
Figure 3:
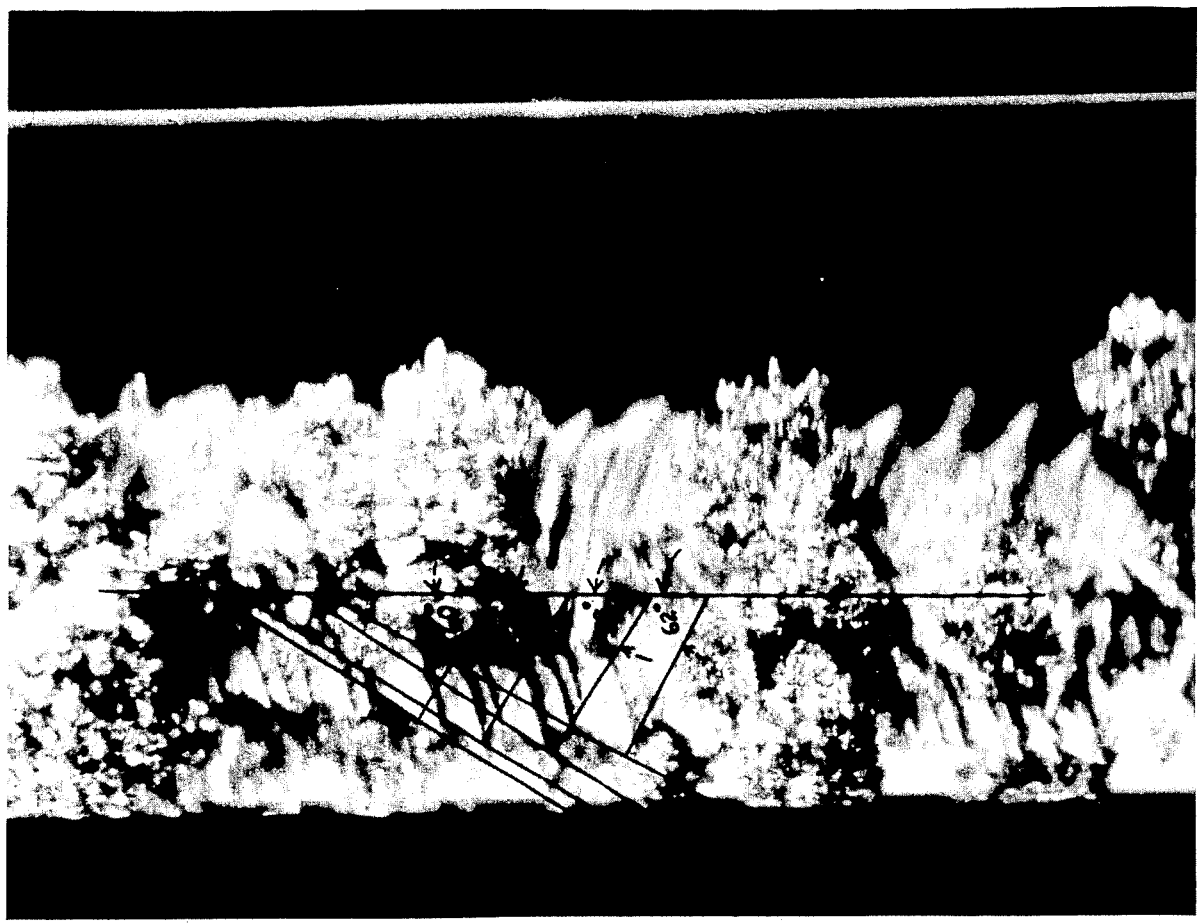

The crystals of the present invention have a crystallographic external morphology made up of blocky facets, in some cases, and leafy dendritic features, in other cases, depending upon manufacturing parameters. A typical example of a crystal with a blocky facet surface is shown in FIGS. 1, 2 and 3—FIG. 1, magnification 2X; FIG. 2, magnification 8X; and FIG. 3, magnification 10X. These macrophotographs demonstrate that the edges of the facets are sharp, straight and parallel. Most surfaces are planar. As shown in FIG. 3 by the superimposed lines, the facets intersect at an angle of 60°±2° within the accuracy of the measurement thereof.

Although all crystals shown the orientation-dependent growth characteristic, the actual macroscopic visual shape varies depending on manufacturing parameters.

Figure 4:
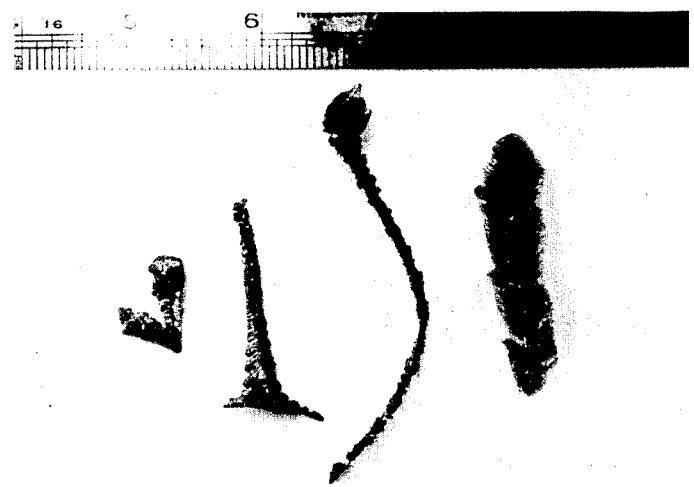

A view of four different macroshapes is shown in FIG. 4. These same samples are shown at magnification 1.4X in FIGS. 5a, 5b and 5c.

Figure 5A:
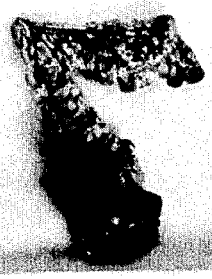
Figure 6A:
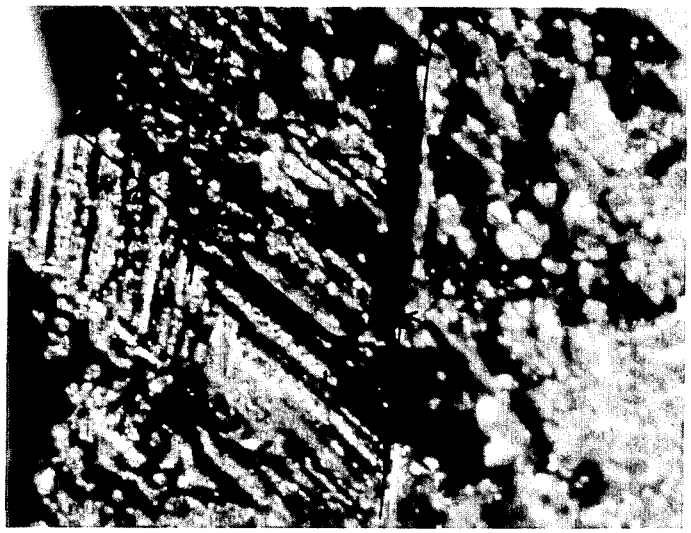
Figure 6B:
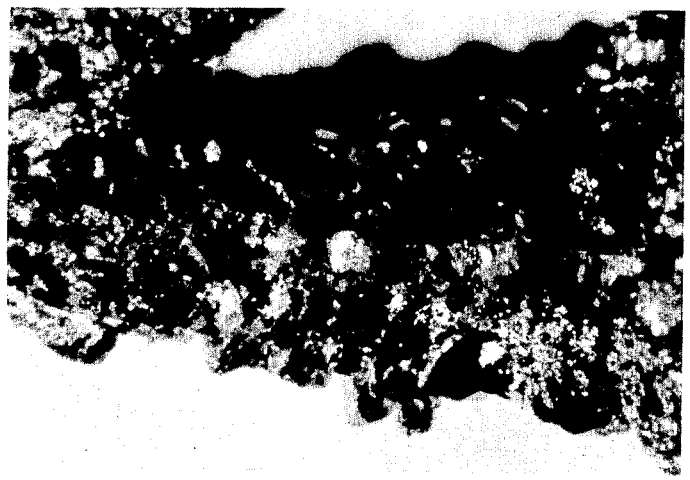

A magnified view of the "feathery"-type crystal of FIG. 4 is shown in FIG. 6a FIG. 6b is a magnified view of FIG. 5a showing a blocky-type external morphology.

Figure 7A:
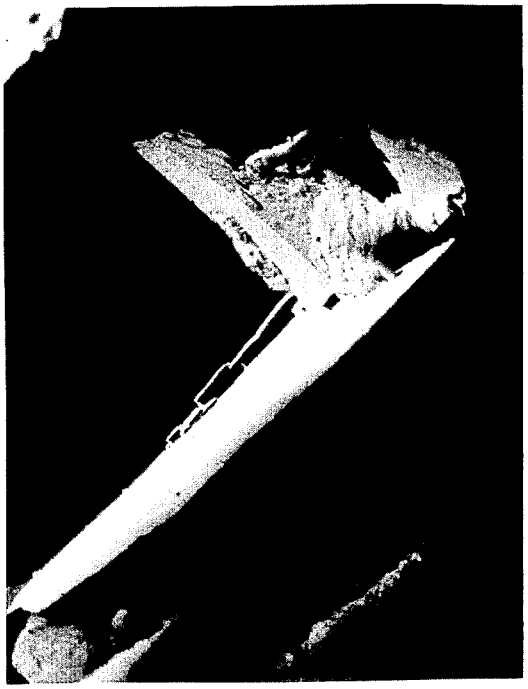
Figure 7B:
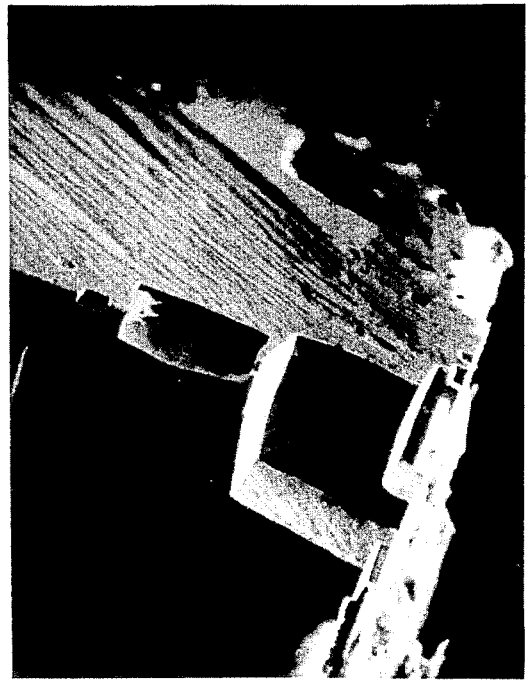
Figure 7C:

Other views of the surface morphology of the new crystals are shown in FIGS. 7a (400X), 7b (800X) and 7c (10,000X), which are photographs taken by a scanning electron microscope. The crystallographic character of the growth is clearly visible. FIGS. 7b and 7c are views of the surface of one of the crystal facets which is smooth but not perfectly flat, clearly showing the step-growth nature of the surface.

Figure 8A:
Figure 8B:
Figure 8C:
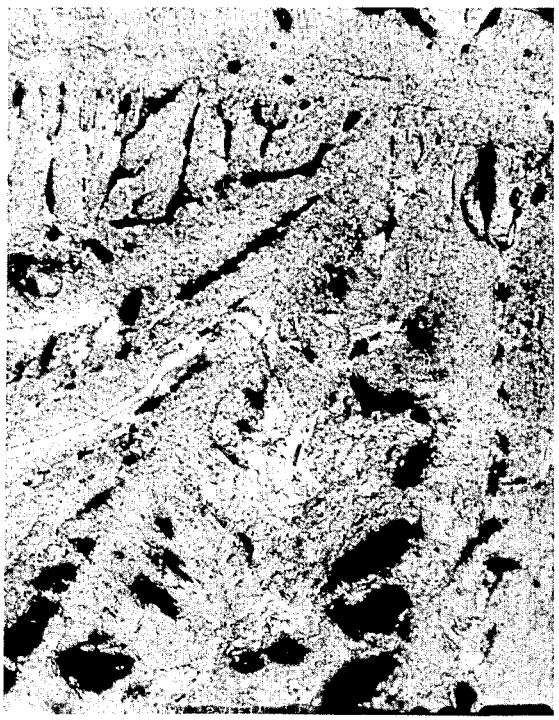
Figure 8D:
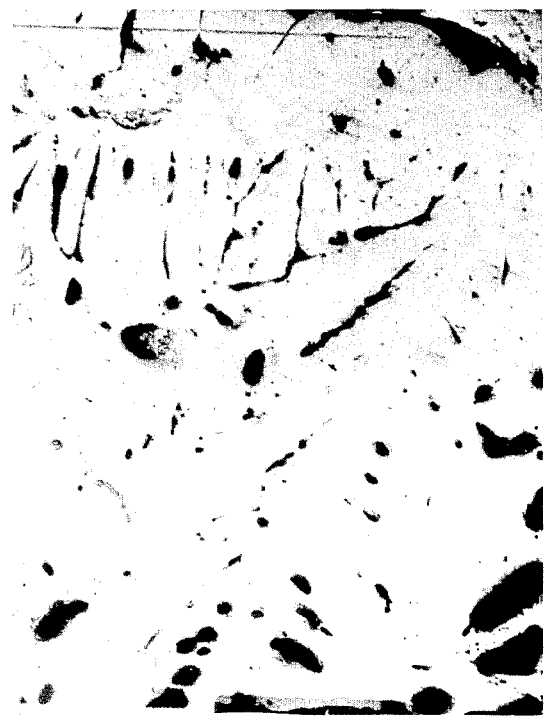

The photomicrographs FIGS. 8a and 8b are etched and unetched views, respectively, of the microstructures of one crystal. The unetched microstructure shows some porosity, but only between the dendritic arms or block interfaces. The matrix itself is free of trapped gas or voids and contains no oxide inclusions. The crystal of FIGS. 8a and 8b has a single boundary parallel to the growth axis, probably a twin boundary since it is exceptionally planar. The pits themselves show a definite crystallographic shape and are probably dislocation etch pits. One grain shows more pitting than the other because it has a more favorable orientation for dislocation etch pit formation, which is known to be highly orientation-dependent. The most important observation is that no grain boundaries, with the one exception, are present. This can be seen in FIG. 8c when compared to FIG. 8d. The region shown in this photograph is a single crystal, even though the growth is dendritic.

Figure 9A:
Figure 9B:
Figure 9C:
Figure 9D:
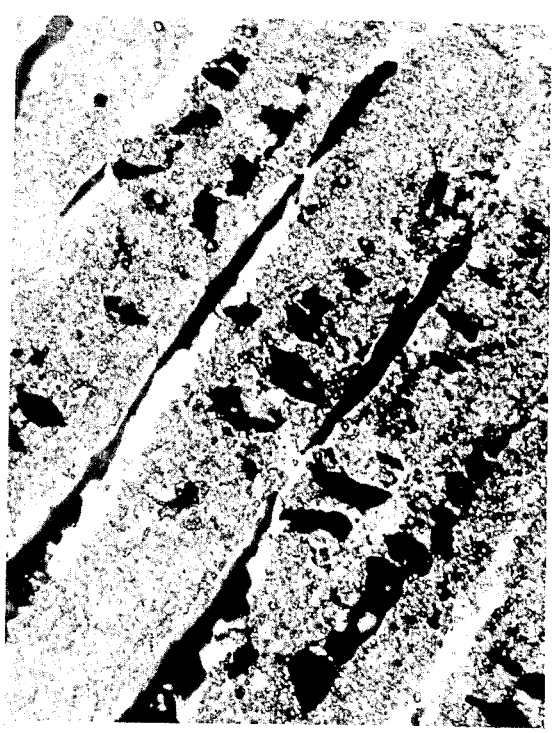

FIGS. 9a and 9b are photomicrographic views of the unetched crystals at 100X magnification. FIG. 9a shows dislocation etch pits but no grain boundaries. FIG. 9 shows a region containing some porosity, but no oxide inclusions or other evidence of inhomogeneity in the matrix. FIGS. 9c and 9d (200X) clearly show the crystallographic character of the etch pits.

Figure 10:
Figure 10A:
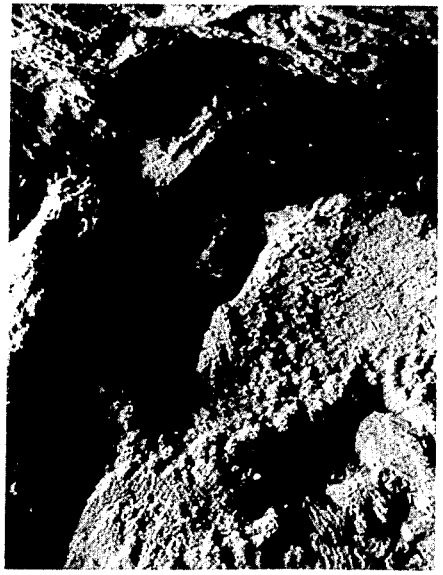

The contrast between the microstructure and surface morphology of the crystals of the present invention when compared to a sample of cathode copper is striking. FIG. 10 shows the microstructure of cathode copper which is a fine-grained polycrystalline aggregate containing inclusions with large voids between the growing particles. By contrast, referring to FIGS. 8 and 9, the crystals of the present invention contain far fewer grain boundaries and, in fact, in some samples no grain boundaries at all. FIG. 10a shows the surface morphology of cathode copper at a magnification of 800X which should be compared to FIG. 7b.

The crystallographic axis parallel to the direction of rapid growth, i.e., the long axis of the crystal, is identified by back reflection Laue X-ray patterns of the crystals. Typical results ae shown in FIGS. 11a–11e.

Figure 11A:
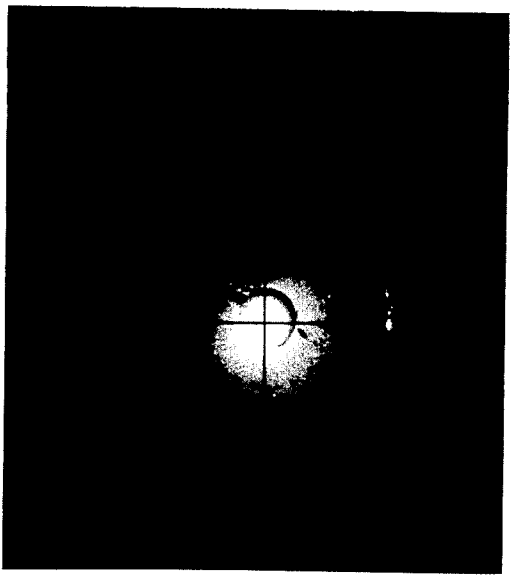

FIG. 11a is an X-ray pattern showing a strong texture. The specimen which produced this X-ray pattern is shown in FIGS. 5a and 6b. It is not a single crystal although there is a strong tendency for lattice alignment between adjacent blocks.

Figure 5B:
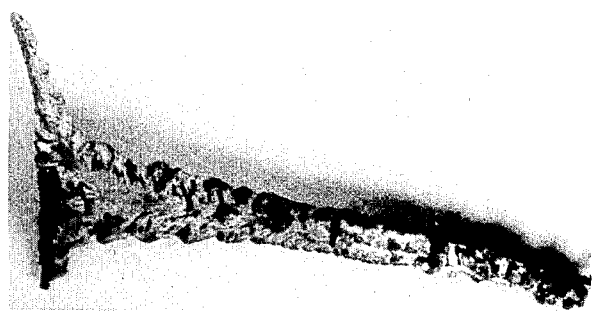
Figure 5C:
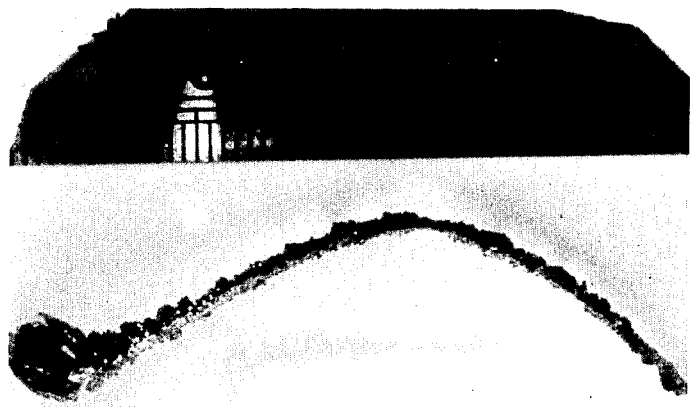
Figure 11B:

FIG. 11b is an X-ray of the crystal shown in FIG. 5b. This is a single crystal pattern, and in fact is nearly identical to the patterns shown in FIGS. 11c and 11d which were taken at the center and near the top, respectively, of the crystal shown in FIG. 5c.

Figure 11C:
Figure 11D:
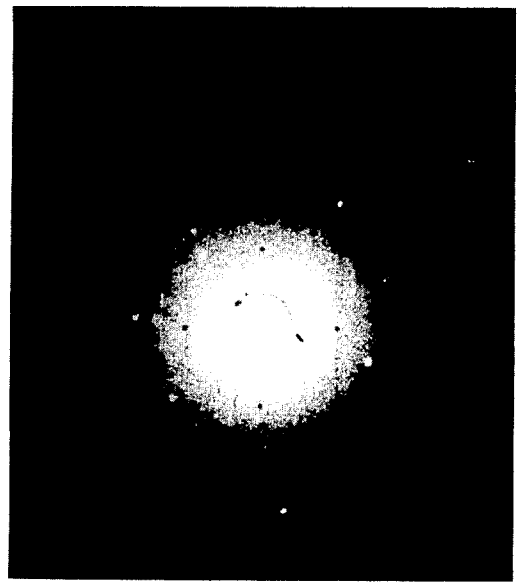

The fact that FIG. 11b is very nearly identical to FIG. 11c indicates that these two crystals grew with the same growth orientation. The fact that FIGS. 11c and 11d are very nearly identical indicates that the sample is in fact a single crystal, i.e., has the same lattice orientation over an appreciable distance.

Analysis of the patterns shows that the long axis of the crystal is a [110] direction (which in fact is the direction along which the Cu atoms are in contact in the face-centered cubic structure) while the surface planes perpendicular to the smallest cross-sectional dimension are (111) planes (which in fact are planes of maximum atomic packing in the face-centered cubic structure).

The X-ray patterns show that the spots lie on hyperbolae which intersect at a common point near the center of the pattern. Each hyperbola is produced by a zone of reflecting planes. The intersection of these zones has been identified as the (111) pole.

Figure 11E:
Figure 11F:

Examination of FIG. 11e shows that the dendritic-type crystal (see FIG. 6a) also grows with the same crystal orientation as the other two crystals, i.e., a [110] direction parallel to the main stem, and a (111) plane parallel to the surface of the leaf. In fact, if one analyses the secondary arms of the dendrite, one finds that they make an angle of 60° with the main stem and are also a [110] type direction. The tertiary arms are parallel to the main stem and thus have the same crystal direction as the main stem. FIG. 11e thus confirms the fact that the crystal shown in FIG. 6a is a single crystal even though it appears to be made up of massive numbers of small stems and leafs protruding from a main stem. All of these protrusions grow with the same crystal lattice orientation.

The macrocrystals of the present invention are extremely pure; in fact, there appears to be no known commercial technique for obtaining copper of this purity and, further, laboratory methods for obtaining copper of this degree of purity are extremely expensive. The purity of the crystals manufactured in accordance with the present invention is so high that customary analytical techniques cannot be reliably employed, the level of most impurities being below the limits of detection of conventional analytical instruments and techniques. Consequently, resort must be had to more indirect measurements of purity, for example, the residual resistivity ratio (RRR) as measured by the direct current method.

The term "RRR" is defined as the ratio of the electrical resistivity of the sample at 273° K (0° C) to that at 4.2° K (liquid helium temperature), i.e., $\rho$ (273° K)/$\rho$ (4.2° K). The resistivity at 273° K is determined only by the thermal oscillation of the atoms and is essentially independent of purity. On the other hand, the resistivity at 4.2° K depends only on purity and is essentially independent of thermal oscillation. Thus, a high-purity specimen will have a small value for the denominator and therefore a large resistivity ratio. Furthermore, the results of RRR testing are independent of the shape of the specimen to first order.

The copper crystals of the present invention have demonstrated RRR values as high as 1361 compared to RRR of 100 for OFHC copper rod after stress-relief annealing and 100 for OFHC copper wire, also stress-relieved. Reported values for commercially available large single crystals of copper are in the range 60 – 70. The RRR testing of samples of the crystals of the present invention also reveal a striking anomoly in that the RRR value decreases after vacuum annealing, whereas it is well known that an oxidizing anneal of conventional copper products results in an increase of RRR.

A neutron activation analysis of crystals of the present invention failed to detect any impurities at all and, although this test was only qualitative, the results are consistent with the RRR measurements. A spectrographic analysis yielded the following results:

Table 1

| Ag | 0.0001% | Sn | 0.00032% |
|---|---|---|---|
| Fe | 0.0008% | Pb | 0.00008% |
| Zn | 0.0004% | As(N.D)< | 0.0002% |
| Bi(N.D)< | 0.0001% | Ni(N.D)< | 0.0001% |
| Cd(N.D)< | 0.0003% | Sb(N.D)< | 0.0005% |
| Mn(N.D)< | 0.0001% | Te(N.D)< | 0.0005% |

N.D. = Not detected

Microstructural examination of specimens prepared by melting the crystals of the present invention and then allowing them to re-solidify reveals that the specimens are essentially free of grain boundaries, gas cavities, inclusions, or other second-phase particles. This is highly unusual in that normally copper solidifies in a manner resulting in a polycrystalline material. By comparison, the grain size of the recrystallized specimens was approximately 1.0 mm., which is 20 times larger than the grain size of cast prior art coppers reported in the literature. These melted and re-solidified samples are extremely soft in the fully annealed condition, i.e., 0% cold work. Knoop micro-hardness readings average about 53Kn, while Rickwell "F" readings average about 10 $R_f$. A typical hardness value for annealed OFHC copper is about $R_f$45. The cast samples can be rolled to a thickness of 0.003 inches, with no signs of cracking. Measurement of the recrystallization temperature of copper obtained by melting the crystals of the present invention and then cold-rolling and annealing demonstrates that even after melting, the crystals are equivalent or higher in purity than ETP or OFHC copper and it appears that only the impurities introduced during the melting and rolling or annealing result in increasing the impurity level such that the recrystallization temperature is higher than that for spectroscopically pure copper.

The copper crystals of the present invention are directly useful as highly pure conductors and will function as highly efficient solar radiation collectors because of their faceted external morphology. However, the crystals achieve their maximum economic potential when directly cast into ingots or other shapes suited for direct fabrication into end-use products, such as rod or wire, without intermediate electrorefining or annealing steps; because of their reduced initial hardness, such shapes can be more easily fabricated than conventional copper products and the cost and complexity of present pyrometallurgical and electrorefining processes are significantly reduced.

The following examples illustrate various properties of the novel copper crystals of the invention.

EXAMPLE 1

Melting

Crystals were rinsed in dilute HCl, distilled water, and reagent grade methanol and dried in a stream of air; they were immediately placed in a high purity graphite boat in a cylindrical cavity one-fourth inch in diameter and 2 inches long. The boat was inserted into a horizontal quartz tube around which an induction coil was fixed. A vacuum stopcock attached to one end of the quartz tube allowed either hydrogen or helium to flow into the tube, and the other end was designed so that a mechanical rotary vacuum pump could be attached to the system and the tube evacuated. The pressure was not measured; however, a valve of about $10^{-2}$ to $10^{-3}$ mm Hg is within reason for the type of pump used.

After inserting the boat containing the crystals into the induction coil, hydrogen was introduced into the system and allowed to flow over the sample and out of a nozzle on the opposite end of the quartz tube, where it was burned off. The hydrogen continued to flow while the crystals were melted and held in the molten state for one minute, and cooled to form a solid "button", typically one-half inches long with a diameter conforming to the graphite boat cavity.

After cooling, the stopcock was switched to allow helium to flow into the system, purging the hydrogen. At this point, either the sample was remelted while the flow of helium continued, or the vacuum pump was connected to the system, the stopcock closed, the system evacuated and the sample remelted. The first of these alternatives produced "buttons" hereafter referred to as "helium melted", and the second, buttons hereafter referred to as "vacuum melted". In each case, the copper was held in the molten state for one minute, allowing considerable stirring by the induction coil field. The samples were allowed to solidify and cool to room temperature in either helium or vacuum depending on the melting conditions. These samples are hereafter referred to as "as-cast buttons".

Figure 12:

One helium melted button in the as-cast condition was sectioned, mounted and polished for microstructural examination. The microstructure, shown in FIG. 12, is free of grain boundaries, gas cavities, with few inclusions and no second phase particles. This samll sample is in fact a single crystal, which is surprising since normally a polycrystalline material results when commercial copper solidifies.

EXAMPLE 2

Rolling and Hardness

Figure 13A:
Figure 13B:
Figure 13C:
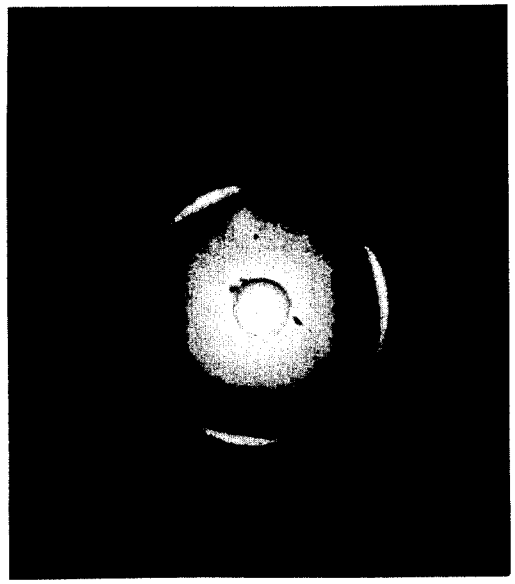
Figure 13D:
Figure 13E:
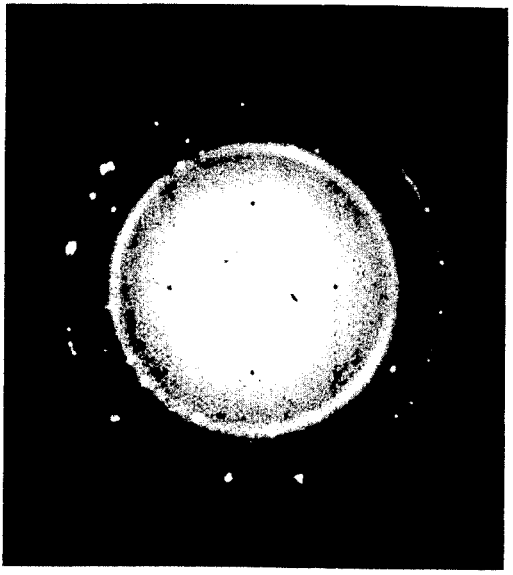
Figure 13F:
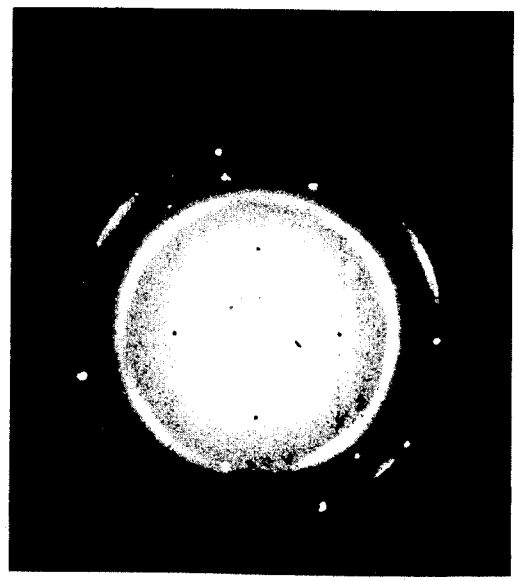
Figure 13G:
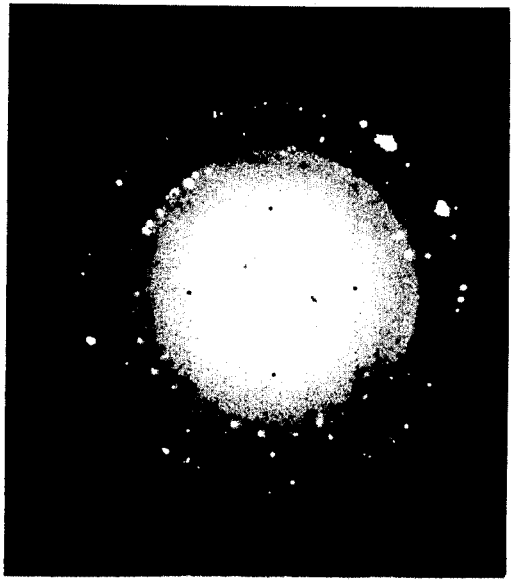
Figure 13H:
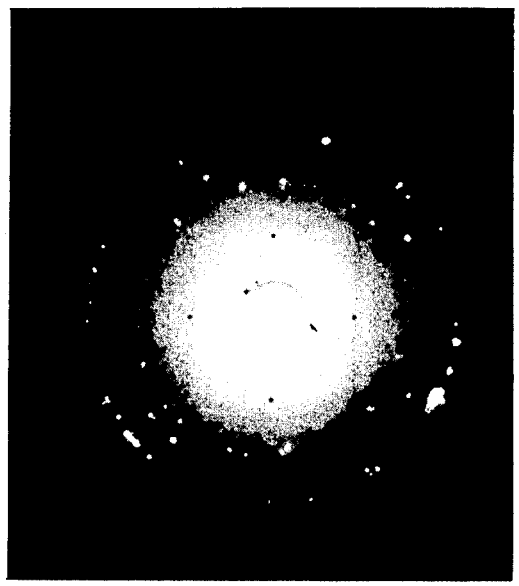
Figure 13:
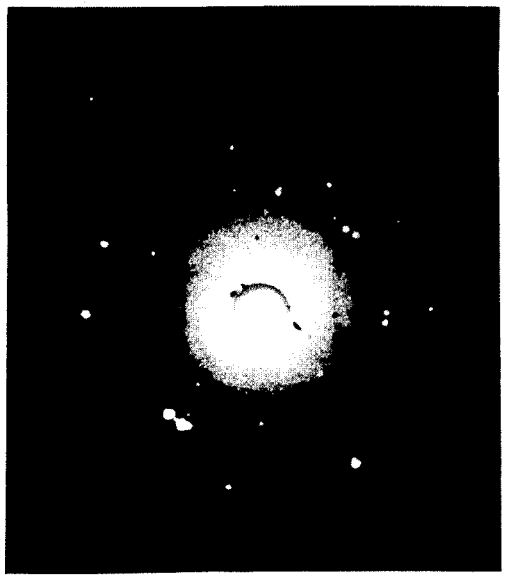
Figure 13:
Figure 13:
Figure 14A:
Figure 14B:
Figure 14C:
Figure 14D:

A total of seven buttons, three vacuum melted and four helium melted, were rolled to a thickness of 0.200 inches, sealed in a pyrex capsule, evacuated to about $10^{-3}$ mm Hg and annealed for 1 hour at 350° C. The anneal served to produce a fully recrystallized microstructure with an average grain diameter of 1.0 mm. Typical pin-hole Laue back reflection x-ray patterns taken with Cu radiation are shown in FIG. 13a after rolling, and in FIG. 13b after annealing at 350° C. FIG. 13a shows the presence of a very strong texture, and in fact, is the type of pattern one would obtain from a very large grained sample severely cold worked. The pattern in FIG. 13b is typical of a well annealed polycrystalline sample with a grain size approximately equal to the diameter of the beam. The pattern can be described as the superposition of Laue patterns produced by two or three individual grains.

After this initial recrystallization anneal, hardness measurements were made on the samples. The samples were so soft that the Rockwell F Scale had to be used rather than the Rockwell B Scale. Average, maximum and minimum values for each type of melt are listed in Table 2 in the 0% cold work column. On the average, the vacuum melted samples were slightly softer. The numbers reflect readings from four helium melted buttons, and three vacuum melted buttons. The range of values between samples was greater than the range within one sample. Knoop microhardness readings were also made on the buttons, and produced average values of 54 Kn for helium melting and 53 Kn for vacuum melting. The differences in hardness are not large enough to attach any significant difference to the properties of copper crystals melted in helium as compared to those melted in vacuum.

To determine the strain hardening characteristics of the samples, all samples were cold rolled to 50% reduction in area (% R.A.). The thickness change per pass was 0.005 inches, and hardness tests were made at each 10% increment in area reduction. One helium melted sample and one vacuum melted sample were rolled further to 75% R.A.

The results of the hardness tests are shown in Table 2. Readings were made using the Rockwell B Scale on all samples except the initial sample with 0% cold work, which was too soft to register on the B Scale. The Rockwell F Scale, used to determine the initial hardness, was also used on several of the cold worked samples. The F scale does not penetrate as deeply as the B scale and therefore is affected to a greater extent by the surface hardness, which results in abnormally high hardness values for small amounts of cold work. Nevertheless, the data show that most of the hardening occurs in the very early stages of cold work, i.e., within the first 10% R.A.

Table 2

| | | | HARDNESS AS A FUNCTION OF COLD WORK (% R.A.) | | | | | | | | |
|---|---|---|---|---|---|---|---|---|---|---|---|
| | | | 0% | 10% | 20% | 30% | 40% | 50% | 60% | 70% | 75% |
| Helium Melted | $R_F$ | Max | 23 | 81 | 86 | 90 | 93 | 96 | 94 | 95 | 97 |
| | | Ave | 11 | 73 | 84 | 87 | 89 | 91 | 93 | 95 | 95 |
| | | Min | 4 | 69 | 78 | 83 | 83 | 88 | 92 | 94 | 93 |
| | $R_B$ | Max | | 34 | 43 | 51 | 56 | 63 | 61 | 62 | 64 |
| | | Ave | | 22 | 39 | 47 | 50 | 56 | 60 | 61 | 62 |
| | | Min | | 15 | 29 | 39 | 43 | 47 | 59 | 61 | 60 |
| Vacuum Melted | $R_F$ | Max | 15 | | | | | 92 | 93 | 96 | 96 |
| | | Ave | 7 | | | | | 91 | 93 | 95 | 95 |
| | | Min | 3 | | | | | 90 | 93 | 94 | 94 |
| | $R_B$ | Max | | 35 | 47 | 51 | 63 | 56 | 59 | 62 | 65 |
| | | Ave | | 28 | 39 | 45 | 51 | 54 | 58 | 61 | 62 |
| | | Min | | 25 | 32 | 40 | 46 | 50 | 57 | 61 | 57 |

Each average value reflects a minimum of 4 readings. In most cases the average represents 20 readings on different buttons of each melt.

The metals Handbook (A.S.M., 1961), Volume 1, lists typical hardness values for ETP copper, and for OF copper in flat plate form with a thickness of 0.040 inches. Their values for initial hardness are $40R_F$ for a sample with a 0.050 mm grain size for both ETP and OF copper and $45R_F$ for a sample with a 0.025 mm grain size for ETP copper. As stated earlier, the grain size of samples prepared from the crystals was approximately 1.00 mm, which is considerably (20 times) larger than the samples reported in the handbook. It is well known that impurities, especially silver, tend to reduce the grain size of recrystallized copper.

The copper samples are much softer initially than are typical ETP or OF coppers, probably due to the higher purity of the starting copper, which in itself will produce a softer product, and which will also produce a larger initial grain size causing a further reduction in hardness.

Since grain size depends on annealing temperature, it is important to point out that the samples were annealed at 350° C, which is lower than the minimum temperature of 375° C recommended in the Metals Handbook. Therefore, the larger grain size cannot be attributed to a high annealing temperature.

The hardness values of $R_F$ 95 and $R_B$ 62 for samples cold worked to 75° R.A. compare exactly to the values $R_F$ 95 and $R_B$ 62 for ETP copper in the extra spring temper published in the Metals Handbook. No data is listed in that source for OF copper. The hardness values at 40% R.A. (i.e., $R_F$—89 and $R_B$—50) compare very well to Metals Handbook values of $R_F$—90 and $R_B$—50 for ETP copper in hard temper.

Table 3

$R_F$ HARDNESS AS A FUNCTION OF ANNEALING TEMPERATURE (° C)
(annealing time = 1 hour)

| | | | 175 | 200 | 225 | 250 | 260 | 270 | 280 | 300 | 350* |
|---|---|---|---|---|---|---|---|---|---|---|---|
| Helium Melted | Cold Work =50% R.A. | Max | 91 | 89 | 82 | 77 | 73 | 62 | 63 | 40 | 23 |
| | | Ave | 90 | 87 | 81 | 77 | 71 | 58 | 57 | 37 | 11 |
| | | Min | 89 | 86 | 79 | 76 | 70 | 51 | 54 | 27 | 4 |
| | Cold Work =75% R.A. | Max | | 74 | | 51 | | | | 23 | 9 |
| | | Ave | | 71 | | 45 | | | | 20 | 5 |
| | | Min | | 66 | | 41 | | | | 17 | 4 |
| Vacuum Melted | Cold Work =50% R.A. | Max | | 88 | | 78 | | | | 36 | 15 |
| | | Ave | | 87 | | 77 | | | | 35 | 7 |
| | | Min | | 86 | | 77 | | | | 34 | 3 |
| | Cold Work =75% R.A. | Max | | 85 | | 63 | | | | 28 | 7 |
| | | Ave | | 81 | | 56 | | | | 24 | 6 |
| | | Min | | 78 | | 49 | | | | 19 | 5 |

*Cold work ≠ 50%. Hardness readings made after annealing. Buttons rolled to 0.200" thick after casting.

The data on hardness as a function of cold work show that the copper crystals of this invention have properties equivalent to ETP or OF coppers, and in fact, has a lower initial hardness in the annealed condition than either of these. This lower initial hardness is attributed to a higher purity starting material.

Cold rolling of the samples to a thickness of 0.003 inches (the limits of the rolling mill) could be continued without introducing cracks in the sample. In fact, one is able to cold roll an as-grown crystal into a strip without fracturing the crystal.

EXAMPLE 3

Recrystallization

The recrystallization temperature of samples prepared from the copper crystals was determined by annealing 50%. R.A. and 75% R.A. cold rolled specimens for one hour at various temperatures. Hardness measurements were made after cooling, and pin-hole back reflection Laue X-ray patterns were taken to identify the degree to which recrystallization had progressed.

The results of the hardness tests are given in Table 3. The results of the X-ray examination are shown in FIG. 13d through FIG. 13k and in FIG. 14. The data in Table 3 show that the hardness begins to fall off rapidly at an annealing temperature of about 225° C, in the 50 % R.A. samples, and at 200° C in those with 75% R.A., the X-ray data on the 50% R.A. samples show that recrystallization begins at temperatures less than 200° C, in one hour, and is 100% complete at 280° C. Those samples with 75% R.A. have X-ray patterns (see FIG. 14) which show recrystallization is about 70% complete at 200° C and 100% complete at 250° C.

The hardness continues to drop up to 300° C, but this is probably due to grain growth, which occurs very readily in the samples. The data obtained show that recrystallization is complete in the 50% R.A. samples at 280° C, and at 250° C in the 75% R.A. samples. The Metals Handbook lists values of 200° C to 325° C for the recrystallization temperature of ETP or OF copper, depending on purity. Spectroscopically pure copper recrystallizes at about 165° C in one hour with 50% R.A., and at about 140° C in one hour with 75% R.A.

Since recrystallization temperature depends on purity, if other factors such as cold work are equal, these data show that even after melting the samples are equivalent in purity to ETP or OF copper. However, enough impurities may have been introduced during melting, rolling, or annealing to increase the impurity level to a value greater than that for spectroscopically pure copper.

EXAMPLE 4

Resistivity Ratio Measurements on Foil Strips and Wires

In order to study the effect of melting on purity, RRR measurements were made on copper foil strips cut from copper rolled to 0.010, inch sealed in a quartz tube, evacuated to about $10^{-3}$ mm Hg and annealed at 400° C for one hour. Two samples, R-4 and R-5, produced identical RRR values of 121 in the as-cut condition. Each of these strips was then placed in a pyrex capsule, evacuated to $10^{-3}$ mm Hg, sealed and annealed at 400° C for one hour. An increase in RRR from 121 to 350 for R-5, and from 121 to 362 for R-4 resulted.

This increase is probably due in part to the annealing of damage produced at the edges of the strips during cutting.

A second anneal was done at 1000° C. Strip R-4 was sealed in quartz, evacuated to $10^{-3}$ mm Hg, sealed, and held for one hour at 1000° C. This treatment resulted in a decrease in RRR to a value of 78. The decrease may be due to vacancies trapped in the copper lattice when cooling from 1000° C to room temperature.

Specimen R-5 was placed in a quartz tube along with a small quantity of $Fe_2O_3$. The purpose of the $Fe_2O_3$ was to provide a source of oxygen so that the oxygen content would remain adequate to produce oxidation of the impurities in the copper, if such impurities are in fact present. The INCRA report (Annual Report, INCRA Project No. 186, F. R. Fickett, National Bureau of Standards) shows that even zone refined copper contains sufficient impurities so that an oxidizing anneal at 1000° C will cause an increase in RRR, presumably because of impurity oxidation. After evacuating the quartz capsule and sealing it, the sample was held at 1000° C for one hour.

At 1000° C, the partial pressure of oxygen in $Fe_2O_3$ is about $10^{-5}$ mm Hg[4], therefore this oxygen pressure should be maintained within the capsule during annealing. The result of this treatment was an increase in RRR to 593.

The wire samples were prepared by hand drawing through a series of dies at room temperature. RRR values were measured after a vacuum anneal in a sealed capsule at 400° C for 1 hour. The results were 168, 83 and 82, respectively. One of the wire samples, RW-1, was prepared from a crystal melted in a high purity $Al_2O_3$ boat rather than a graphite boat. Its higher RRR value is certainly due to less contamination during melting or drawing.

The results of RRR measurements on foil strip and wire samples show that some contamination was introduced during melting and fabrication, more so in the wires than in the strips. The strips maintained a purity level still in excess of OFHC copper as reported by the fracture. The load in each case dropped off to about five pounds (from maximum of near 200 lbs) before the sample separated into two parts.

Table 4

TENSILE TEST RESULTS

|  | | 0.2% Offset Yield Strength | Ultimate Strength | % Elongation in 1 inch | % Reduction in Area |
|---|---|---|---|---|---|
| Helium Melted | | 4,900 ± 100 psi | 28,000 ± 150 psi | 40 ± 1%% | 100% |
| Vacuum Melted | | 4,900 ± 100 psi | 29,300 ± 150 psi | 43 ± 1%% | 100%% |
| | | 4,600 ± 100 psi | 27,200 ± 150 psi | 37 ± 1% | 100% |
| | | 3,850 ± 100 psi | 27,100 ± 150 psi | 38 ± 1% | 100% |
| ETP Annealed | A) | 10,000 psi | 32,000 psi | 45%+ | |
| | B) | 11,000 psi | 34,000 psi | 45%+ | |
| OFHC Annealed | | 10,000 psi | 32,000 psi | 45%+ | | the lower yield strengths are due to higher purity

+in 2 inch gage length
A) grain size = 0.050 mm
B) grain size = 0.025 mm

INCRA report. Two of the wire samples show a slightly reduced value below that for OFHC copper, but showed room temperature electrical resistivity not significantly different from OFHC copper. The small amount of contamination was probably introduced during the wire drawing operation.

The results of this phase of the study confirm the earlier conclusions that the copper product, even after melting and fabrication, maintains a purity equivalent to, or higher than, OFHC copper available commercially today.

EXAMPLE 5

Mechanical Properties — Tensile Tests

Tensile tests were done using flat plate specimens with a 1.18 inch gauge length and with cross section dimensions of 0.182 × 0.040 inch.

One button melted in a helium atmosphere and one button melted in vacuum were cold rolled from an initial thickness of 0.100 to 0.040 inch in increments of 0.005 inch per pass. A jeweler's saw was used to cut two samples from each rolled strip. These samples were then sealed in a pyrex tube under a vacuum of $10^{-3}$ mm Hg and annealed for one hour at 400° C. This produced a fully recrystallized microstructure with a grain size approximately one mm in diameter.

Testing was done using an Instron Universal Testing Machine. To obtain possible accuracy, a load cell with a 200 lb. maximum load was used initially. The specimens were gripped between flat plate jaws and loaded at a strain rate of 0.02/min. up to a load of 200#, and then unloaded. The load-extension curve recorded by the Instron was used to determine the 0.2% offset yield strength of the specimen. At this point, the strain in the specimens was uniform over the entire gage length, with a value equal to about 17% R.A.

Because the maximum load of the initial cell was approached before the specimens failed, a second load cell was used to pull the samples to failure. Each sample was reinserted into flat plate grips and loaded to fracture at the same strain rate used in the initial test. From the recorded load-extension curve, one obtains the ultimate tensile strength and the total elongation at fracture.

Mechanical properties are shown in Table 4. The vacuum melted samples have a somewhat lower value for both yield and ultimate strength, and also show slightly less ductility, in terms of % elongation at fracture. In the % reduction in area column, Table 4, a value of 100% is listed for all samples. This value was listed because each sample necked to a knife edge before A comparison was made between the mechanical properties of the samples and typical mechanical property values for other types of copper listed in the Metals Handbook.

For oxygen-free (OF) copper, the handbook lists values of 10,000 psi for yield strength, 32,000 psi for ultimate tensile strength, and an elongation of 45% in two inches, for a flat product with a thickness of 0.040 inches (identical to the samples) in the annealed condition. As can be seen, the values for yield strength for the samples are considerably lower, i.e., typically 4,900 psi. This is due to the higher purity of the copper, as shown by the high values of RRR. It is well known that increasing purity reduces yield strength. Some of the difference may be due to a larger grain size in the samples, however, this large grain size is due to higher purity, and therefore purity is still the significant factor explaining the lower value for yield strength.

The ultimate tensile strength of the samples are somewhat lower than the 32,000 psi listed in the Metals Handbook for OF copper. However, in relatively pure materials, the ultimate strength is influenced mainly by strain hardening properties which are not extremely sensitive to small amounts of impurities. Nevertheless, the samples show a value which is in line with a copper of high purity than OF copper.

The elongation of the samples after testing of about 40% in one inch is reasonably close to the value of 45% in two inches for OF copper. The one inch gauge length would tend to reduce the elongation to a somewhat smaller value than that for a two inch sample of the same copper.

The results of the mechanical tests show that the tensile properties of the copper of the invention are consistent with a copper of higher purity than commercially available oxygen free or electrolytic tough pitch coppers. The properties are such that ingot cast from these crystals are well suited for direct fabrication into rod or wire. Intermediate process annealing is not required. Results of mechanical property measurements indicate that copper produced from these crystals can be fabricated more easily becauseof its reduced initial hardness.

In addition to the novel article of manufacture described above, I have invented and discovered processes and methods for winning various product metals from solutions of metal values, including copper values. The method and process, considered in its broadest aspects, provide a technique for manufacturing crystals of a product metal and includes the steps of providing an aqueous pregnant solution of a soluble compound of the produce metal in a crystallization zone, establishing and maintaining a concentration step-function of the product metal compound in the crystallization zone, contacting the solution with a reagent metal higher than the product metal in the EMF series or other suitable reducing reagent (the reagent being contacted with the pregnant solution in the region of the lowest product metal compound concentration), continuously maintaining product metal deposited from solution in electrical contact with the reagent metal to thereby initiate and propagate continued growth of crystals of the product metal, and removing the oxidized byproduct of the precipitation reaction from the solution.

As specifically applied to the manufacture of the novel copper crystals described above, the method and process, according to the presently preferred embodiment of the invention, includes the steps of providing an aqueous pregnant solution of $FeCl_2$ and $CuCl_2^{--}$ in a crystallization zone, establishing and maintaining a $CuCl_2^{--}$ concentration step-function in the crystallization zone, contacting the pregnant solution with metallic iron reagent in the region of the lowest $CuCl_2^{--}$ concentration therein, continuously maintaining metallic copper precipitated from solution in electrical contact with the iron reagent to initiate growth of the copper crystals, removing $FeCl_3$ formed when the metallic copper precipitates, and separating the copper crystals thus formed from the crystallization zone.

As indicated above, the method and process of the invention is applicable to winning various product metals from solutions thereof, in particular for manufacturing crystals of the product metal. In this connection, a description follows which is generally applicable to the manufacture of any of the suitable product metals. This description will then be followed by a more detailed description of the presently preferred embodiment of the invention which involves the manufacture of the novel copper crystals described above.

Starting with an aqueous pregnant solution of a compound of the product metal, it is first necessary to establish and thereafter maintain a concentration step-function of the product metal in a suitable crystallization vessel. "Concentration step-function", as used herein, means a marked discontinuity in the concentration of the product metal compound in the aqueous pregnant solution thereof, with the region of the highest product metal compound concentration existing at a point spaced from the "reagent metal" (described below) and the region of the lowest product metal compound concentration existing between the reagent metal and the concentration step-function. This can be accomplished by any suitable known technique such as, for example, by introducing into the bottom of the crystallization vessel a quantity of a compound of the product metal which is either directly soluble in an aqueous medium or which can be rendered soluble therein by the addition of further solubilizing reagents. Of course, it is desirable to initially introduce a quantity of the product metal compound into the crystallization vessel which is at least sufficient to saturate the solution, having regard for the quantity of aqueous solvent contained therein. As the product metal compound dissolves and diffuses through the aqueous solvent, a concentration gradient will be established with the highest product metal concentration existing in the lower region of the crystallization vessel and decreasing at points spaced upwardly therefrom toward the upper part of the crystallization vessel. Alternatively, one can commence with a homogenous solution of the product metal compound and then cause the formation of a concentration step-function by contacting one portion of the solution in the crystallization vessel with a reagent which precipitates or otherwise removes product metal values in a localized portion of the vessel. This precipitation or separation of product metal values in a localized portion of the crystallization zone, coupled with diffusion phenomena, will then establish the required concentration step-function, with the lowest concentration values being encountered in the locus of the removal or precipitation of the product metal and the highest concentration values being encountered in portions of the crystallization vessel which are remote from the locus of removal of the product metal. It is obvious that in order to establish and maintain this concentration step-function, it is necessary that the pregnant solution be maintained in a substantially quiescent state. Therefore, while the temperature and pressure conditions within the crystallization vessel are not highly critical as they affect other aspects of the process, it is important that the combination of pressure and temperature therewithin be adjusted and maintained to prevent substantial thermal convection currents or boiling, which would tend to destroy the product metal concentration step-function. Similarly, care should be exercised to avoid mechanical agitation of the pregnant solution, for the same reason.

Next, in accordance with the most general aspect of the process invention, the pregnant solution is then contacted with a reagent metal which is higher than the product metal in the electromotive force series, the reagent metal being contacted with the pregnant solution in the region of the lowest product metal concentration which is established according to the concentration step-function described above. The electromotive force series ("EMF series") is a listing of the various metals in order of their decreasing tendency to lose electrons; that is, to be oxidized. Or, according to another definition, the EMF series is a list of the various metals in order of their increasing standard electrode potential. The more negative the potential, the greater the tendency of the metal to lose electrons and, therefore, the higher the metal will be found in the EMF series.

As well known to those skilled in the art, when one contacts a pregnant solution of a metal compound with a reagent metal higher in the EMF series than the dissolved metal, the dissolved metal ion and the solid reagent metal react in an ozidation-reduction fashion such that the dissolved metal values are reduced to the metallic state and the reagent metal is oxidized and goes into solution. This is commonly called a "displacement" reaction and is well known in the art, especially in connection with recovery of copper values from dilute solutions thereof according to the so-called "cementation" process in which the copper-bearing solution is contacted under conditions of high agitation with ferric metals. The copper metal precipitates or plates out on the ferric metal and the ferric metal goes into solution. The resultant "cement copper" is a highly impure amorphous product which is then treated according to conventional refining techniques to recover the copper values in a usable form.

In order to initiate and propagate growth of crystals of the product metal within the crystallization vessel, it is necessary to continuously maintain the product metal which is deposited as a result of the displacement reaction between the pregnant solution and the reagent metal in electrical contact with the reagent metal. If the deposited product metal is thus maintained in electrical contact with the reagent metal, the deposition of the product metal will take place according to a mechanism which is not yet fully understood but which is clearly of an electrolytic nature and the result is that the product metal is deposited as large, highly pure, columnar crystals rather than as amorphous powders, highly polycrystalline aggregates, or small equiaxed crystals according to the results of prior art processes involving displacement reactions. As the columnar crystals of the product metal grow away from the reagent metal, toward the region of higher product metal ion concentration in the pregnant solution, the concentration step-function originally established in the crystallization vessel is maintained and moves with the tip of the growing crystal toward the region of highest metal ion concentration. In solutions of colored product metal compounds, this phenomenon can actually be visually observed. When the crystals have grown to the desired product size, they are then removed from the crystallization zone by any convenient technique.

The following description further illustrates the most general aspects of the invention by reference of the application of this technology to the production of the novel copper crystals described above.

The process of the present invention is not limited to the use of any specific techniques for preparing the pregnant solution of cuprous chloride complex ($CuCl_2^-$) and many examples of suitable techniques will be apparent to those skilled in the art. On a practical commercial basis, the pregnant solution can be prepared from dilute mine waters, copper precipitates ("cement copper"), scraps, copper concentrates, etc.

According to the presently preferred commercial embodiment of the invention, the pregnant solution is prepared by treating mine waters which are dilute solutions of copper sulfate with cement copper and hydrochloric acid, according to the equation:

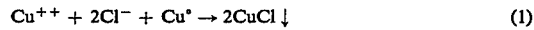

$$Cu^{++} + 2Cl^- + Cu^\circ \rightarrow 2CuCl \downarrow \quad (1)$$

The following example illustrates this technique:

EXAMPLE 6

Preparation of Pregnant Copper Solution From Mine Waters 1000 liters of mine waters consisting of a dilute copper sulfate solution containing other soluble impurities and of pH = 1.5 is mixed with excess wet cement copper and sufficient HCl to satisfy the stoichiometric relationship of equation (1). The mixture is agitated for 20 minutes in a tilting mixer and the CuCl - cement slurry is allowed to settle.

The CuCl plus excess cement slurry is then separated from the mother liquor and reacted with $FeCl_3$ to convert all of the excess cement copper to CuCl according to the following equation:

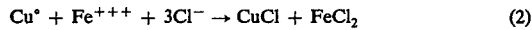

$$Cu^\circ + Fe^{+++} + 3Cl^- \rightarrow CuCl + FeCl_2 \quad (2)$$

During this reaction, sufficient HCl is added to maintain the pH of the reaction mixture below 1.0. The resulting CuCl slurry is then treated in accordance with Example 7.

EXAMPLE 7

Manufacture of Copper Crystals

The CuCl slurry of Example 6 is placed in the bottom of a crystallization cell which is constructed in accordance with FIG. 15 which depicts a standard laboratory desicator 1 having a close-fitting cover 2 and a perforated ceramic plate 3 resting on internal supports 4. $FeCl_2$ brine is added to and agitated with the CuCl slurry to solubilize the CuCl, forming the soluble complex $CuCl^-$. The level of the solution 5 in the cell is adjusted to approximately one-fourth inch above the top of the ceramic plate 3 and excess CuCl slurry 6 settles to the bottom of the cell. The pH of the solution is adjusted to below the precipitation pH of the ions in solution, i.e., below about pH 5, by adding HCl to a concentration of not less than about 1 g/l. A stainless steel screen 7 is placed across the cell in the lower portion thereof to prevent crystals from falling into the impure CuCl mud 6 at the bottom of the cell. The perforated ceramic plate 3 is then placed in the cell on the supports 4 and iron blocks 8 are then placed on the perforated ceramic plate 3 and the cover 2 is placed on the cell 1.

Almost immediately, copper metal begins to plate out on the portions of the iron blocks 8 which are in contact with the solution. This depletes the copper concentration in the immediate vicinity of the iron blocks and begins to establish a copper concentration step-function within the cell. Deposition of the copper continues with copper metal being deposited on the copper previously deposited, forming fingers 9 which grow toward the apertures 10 in the ceramic plate 3. As the fingers 9 grow away from the iron blocks 8, a distinct change in the character of the deposited copper is seen, i.e., the copper deposited on and near the iron blocks 8 appears to be friable and almost amorphous, but as the fingers lengthen and by the time they reach the apertures 10, the copper which is newly deposited then takes on the crystalline character of the novel copper crystals described above and illustrated in FIGS. 1–6.

Within about four or five hours, the copper crystals become visible, extending through the apertures 10 in the ceramic plate 3. Care is taken to avoid inducing any turbulence in the pregnant solution. Thereafter, growth of the crystals 9a continues and, depending on the initial copper concentration in the pregnant solution, virtually all copper ions are extracted therefrom within a period of from five to ten days. As the crystals 9a grow downwardly, the concentration step-function visibly moves downwardly with a distinct color change in the solution (from black/green to blue/green) occurring at a level indicated by the dashed line 11 appearing at approximately the level of the tips of the longest of the growing crystals 9a. Growth of the crystals is continued until they reach the desired size or until all of the copper ions in solution are depleted.

The crystallization cell described in the foregoing example operates as follows. Placing the iron blocks in contact with the pregnant solution apparently initiates a displacement-type reaction with the iron, reducing the cuprous values in solution to metallic copper and itself being oxidized to the $Fe^{++}$ state and going into solution. At the tip of the growing crystal, $Cu^+$ ions are reduced by ferrous ions in solution to copper metal which is deposited on the end of the growing crystal and the ferrous ions are themselves oxidized to the Fe$^{+++}$ state. The ferric iron formed in the tip reaction is continuously removed from solution by reaction with the iron cores wherein it is reduced to the ferrous state.

The reactions involved then are:

$$FeCl_2 + CuCl \rightarrow FeCl_3 + Cu \quad \text{(tip reaction)} \quad (3)$$

$$FeCl_3 + Fe \rightarrow FeCl_2 \quad \text{(core reaction)} \quad (4)$$

While the exact mechanism involved is not yet fully understood, it is obvious from the character of the copper crystals produced that the mechanism is electrolytic in character and it appears that I have provided the conditions necessary for the electrolytic phenomenon to occur without providing any net electrical energy input to the cell. The crystals are manufactured in accordance with this technique without the evolution of any pollutant gases and without the necessity for employing extreme process conditions of pressure or temperature. In fact, the process operates satisfactorily at ambient temperature and atmospheric pressure, with no electrical energy requirement except that required to power small mixers and pumps, etc., and without requiring the use of any specialized reagents or processing materials such as ion exchange resins, etc.

Having now described my novel copper crystals and the presently preferred embodiment of the novel method for manufacture thereof in such terms as to enable those skilled in the art to understand the inventions and practice them, I claim:

1. As a new article of manufacture, a crystal of copper which is
   (a) macrocrystalline,
   (b) unicrystalline,
   (c) columnar,
   (d) a single prime particle bounded by at least two sets of distinguishable (100) planes which are determined by the internal crystal structure, the crystal orientation being such that
      (1) a (110) plane is perpendicular to the long axis of the crystal, and
      (2) a ($\bar{1}$11) plane is perpendicular to the the smallest cross-section thereof,
   said sets of planes defining a plurality of parallel, non-coplanar macroscopic facets, which microscopically are crystallographic step-growth surfaces.

2. A method for manufacturing crystals of a product metal, including the steps of:
   (a) providing an aqueous pregnant solution of a compound of said product metal in a crystallization zone;
   (b) establishing and maintaining a concentration step-function of said product metal compound in said zone;
   (c) contacting said solution with a reagent metal higher than said product metal in the EMF series, said reagent metal contacting said solution in the region of the lowest product metal compound concentration;
   (d) continuously maintaining metal deposited
   (e) removing the oxidized byproduct of the precipitation reaction from said solution;
   the establishment and maintenance of said concentration step-function thereby inducing the formation of crystals of said product metal which are macrocrystalline, unicrystalline, and columnar.

3. A method for manufacturing the copper crystal of claim 1, including the steps of:
   (a) providing an aqueous pregnant solution of $FeCl_2$ and $CuCl_2^-$ in a crystallization zone;
   (b) establishing and maintaining a $CuCl_2^-$ concentration step-function in said zone;
   (c) contacting said solution with metallic iron reagent in the region of lowest $CuCl_2^-$ concentration;
   (d) continuously maintaining metallic copper precipitated from solution in electrical contact with said iron reagent to initiate growth of said crystals;
   (e) removing $FeCl_3$ formed when said metallic copper precipitates; and
   (f) separating the copper crystals thus formed from said crystallization zone;
   the establishment and maintenance of said concentration step-function thereby inducing the formation of crystals which are
      (i) macrocrystalline,
      (ii) unicrystalline,
      (iii) columnar, and
      (iv) a single prime particle bounded by at least two sets of distinguishable (100) planes which are determined by the internal crystal structure, the crystal orientation being such that
         (1) a (110) plane is perpendicular to the long axis of the crystal, and
         (2) a ($\bar{1}$11) plane is perpendicular to the smallest cross-section thereof,
      said sets of planes defining facets which are parallel, non-coplanar, crystallographic step-growth surfaces.

* * * * *

UNITED STATES PATENT AND TRADEMARK OFFICE
CERTIFICATE OF CORRECTION

PATENT NO. : 4,086,082
DATED : April 25, 1978
INVENTOR(S) : Shalom Mahalla

It is certified that error appears in the above-identified patent and that said Letters Patent are hereby corrected as shown below:

In Claim 2, sub-paragraph (d) should read:

(d) continuously maintaining product metal deposited from solution in electrical contact with said reagent metal to initiate and propagate continued growth of crystals of said product metal; and Signed and Sealed this Twenty-ninth Day of August 1978

[SEAL]

Attest:

RUTH C. MASON
Attesting Officer

DONALD W. BANNER
Commissioner of Patents and Trademarks